(12) United States Patent
Chen

(10) Patent No.: US 6,214,709 B1
(45) Date of Patent: Apr. 10, 2001

(54) METHOD OF FABRICATING SELF-ALIGNED SILICIDE

(75) Inventor: Chih-Rong Chen, Chupei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/129,460

(22) Filed: Aug. 4, 1998

(30) Foreign Application Priority Data

Jun. 8, 1998 (TW) .................................. 87109057

(51) Int. Cl.[7] .................................. H01L 21/3205
(52) U.S. Cl. .................................. 438/586
(58) Field of Search .................................. 438/584, 586, 438/592, 649, 651, 655, 664, 682, 660

(56) References Cited

U.S. PATENT DOCUMENTS 4,690,730 * 9/1987 Tang et al. .............................. 21/306
5,529,958 * 6/1996 Yaoita .................................. 437/200
5,593,924 * 1/1997 Apte et al. ............................ 437/200

* cited by examiner

Primary Examiner—David Nelms
Assistant Examiner—Quac Hoang
(74) Attorney, Agent, or Firm—Thomas, Kayden, Horstemeyer & Risley

(57) ABSTRACT

A method of fabricating salicide. A metal layer is formed on a substrate with a polysilicon gate and a source/drain region. A material layer is then formed on the metal layer, wherein the material is selected to produce compressive stress as compressive stress is produced on the substrate and to produce tensile stress as tensile stress is produced in the substrate. The material layer needs to be chosen with the same stress produced by the metal layer. A thermal process is then performed on the substrate to form a silicide on the polysilicon gate and the source/drain region. The material layer and the unreacted metal layer are removed and therefore the salicide process is accomplished.

9 Claims, 2 Drawing Sheets

METHOD OF FABRICATING SELF-ALIGNED SILICIDE

CROSS-REFERENCE TO RELATED APPLICATION

This application claims the priority benefit of Taiwan application serial no. 87109057, filed Jun. 8, 1998, the full disclosure of which is incorporated herein by reference.

BACKGROUND OF THE INVENTION

1. Field of the Invention

The invention relates to a method of fabricating self-aligned silicide (salicide), and more particularly to a method of fabricating salicide for reducing the effect of stress.

2. Description of the Related Art

As the device integration increases, the source/drain region resistance of a MOS device gradually rises until it is equal to the electrons in the tunnel of the MOS. To reduce the sheet resistance in the source/drain region and retain the integrity of a shallow junction of metal and MOS, salicide is accordingly applied in the process.

FIGS. 1A–1D shows a prior art fabricating method for a gate using titanium silicide as salicide. First, as shown in FIG. 1A, a gate oxide layer 102 and a polysilicon layer 104 are formed on the substrate 100. The polysilicon layer 104 and the gate oxide layer 102 are patterned to form a gate structure by photolithography. An ion implantation is next performed on the substrate 100 and a source/drain region 108 is formed therein. An insulating spacer 110 is formed on the sidewalls of the polysilicon layer 104. As shown in FIG. 1A, a layer of titanium 112 is formed over the substrate 100 by RF sputtering. Then, a thermal process is performed to make titanium 112 react with poly gate structure 104 and the source/drain region 108. A salicide 114 is therefore formed on the substrate 100, as shown in FIG. 1B.

In the salicide process described above, the silicide is formed on the source, drain and gate to simplify the step of photolithography and reduce contact resistance. The silicide used in ULSI (Ultra large Scale Integration) is C54-TiSi$_2$ because it has the lowest resistance, the lowest contact resistance and better thermal conductivity. However, as the dimension of devices shrinks to under 0.25 µm, relational stress problems become serious enough to affect fabrication of the device, the gate oxide layer of a MOSFET becomes worse and defects are induced in interconnect lines by stress.

Using titanium to serve as a metal layer of silicide, silicon atoms migrate into the titanium layer as the silicide is formed and a kind of compressive stress is therefore produced in silicide. The appearance of compressive stress inhibits migration of silicon atoms through a Ti/Si interface and hence the formation of TiSi$_2$ is retarded. In addition, the growth rate and the maximum thickness of TiSi$_2$ film is reduced and the film can't be formed continuously. It is also difficult to transfer silicide from C49-TiSi2 to C54-TiSi2 due to compressive stress and it even reduces conductivity of titanium silicide.

Moreover, to relieve the stress between the interfaces, an additional, thinner interlayer, such as molybdenum (Mo) or tungsten (W), is sputtered on the interface. But the interlayer produces defects in the silicide film and the impedance is therefore increased. So this it is not a preferable method of diminishing the stress of the interface.

SUMMARY OF THE INVENTION

It is therefore an object of the invention to lower compressive stress on the silicon substrate as the titanium silicide is formed in such a manner that tensile stress on the titanium silicide is also be reduced. Compressive stress between silicon substrate and titanium can be diminished simultaneously to enhance the formation of the titanium silicide.

Additionally, the formation of a different silicide can be improved because tensile stress on the silicon substrate and tensile stress between the substrate and metal layer both can be reduced while the silicide is formed.

To achieve these objects and advantages, and in accordance with the purpose of the invention, as embodied and broadly described herein, the invention is directed towards a method of fabricating salicide. A metal layer is formed on a substrate with a polysilicon gate and a source/drain region. A material layer is then formed on the metal layer, wherein the material is selected to produce compressive stress as compressive stress is produced on the substrate and to produce tensile stress as tensile stress is produced in the substrate. In this manner, the material layer needs to be chosen with the same stress produced by the metal layer. A thermal process is then performed on the substrate to form a silicide on the polysilicon gate and the source/drain region. The material layer and the unreacted metal layer are removed and therefore the salicide process is accomplished.

It is to be understood that both the foregoing general description and the following detailed description are exemplary and explanatory only and are not restrictive of the invention, as claimed.

DESCRIPTION OF THE PREFERRED EMBODIMENTS

Figure 1A:
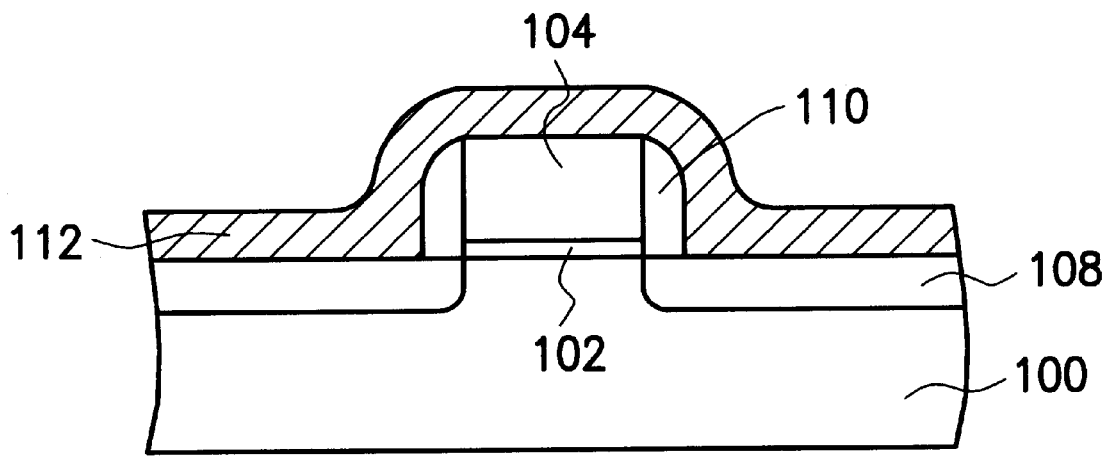
FIGS. 1A–1B is a cross-sectional view of the conventional method of fabricating titanium silicide for silicide gate.
Figure 1B:
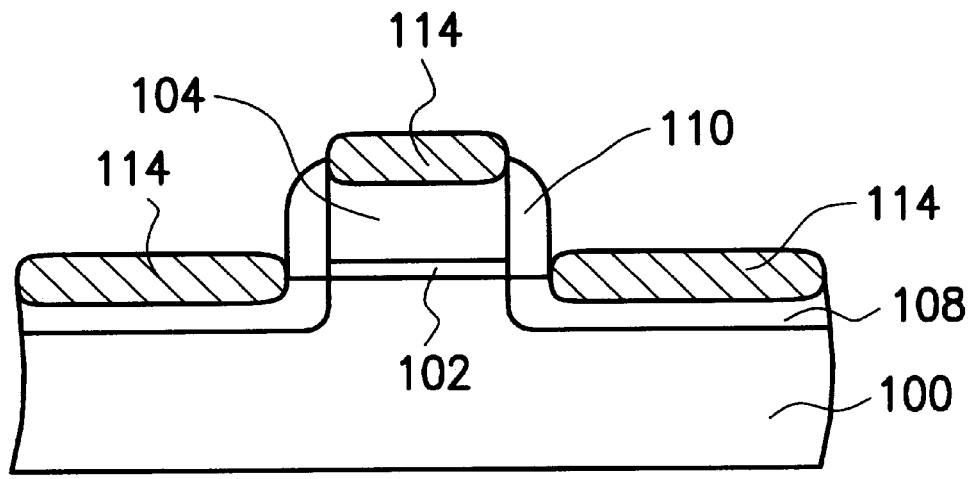
Figure 2A:
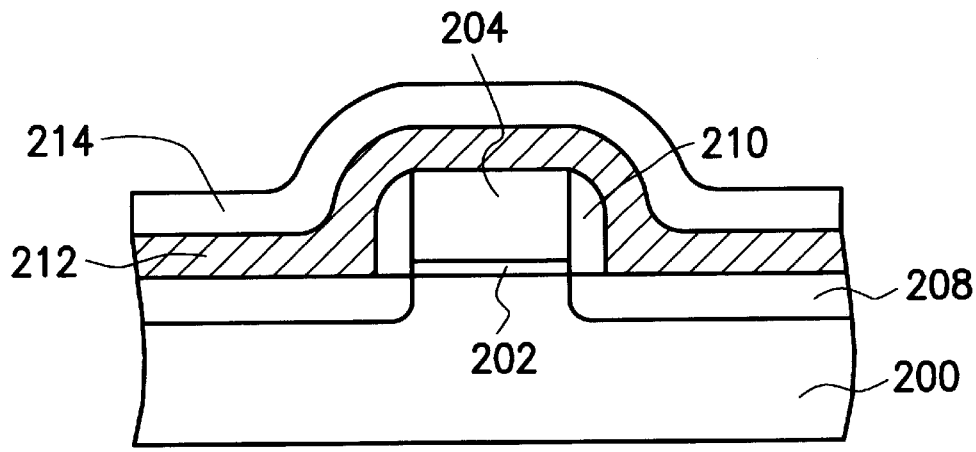
FIGS. 2A–2C is a cross-sectional view of a fabricating method of salicide in a preferred embodiment according to the invention.

Referring to FIG. 2A, a gate oxide layer 202 and a polysilicon layer are formed on the substrate 200 and then patterned by photolithography to form a poly gate structure. Ion implantation is next performed on the substrate 200 and a source/drain region 208 is formed therein. An insulating spacer 210 is formed beside the polysilicon layer 204.

Figure 2B:
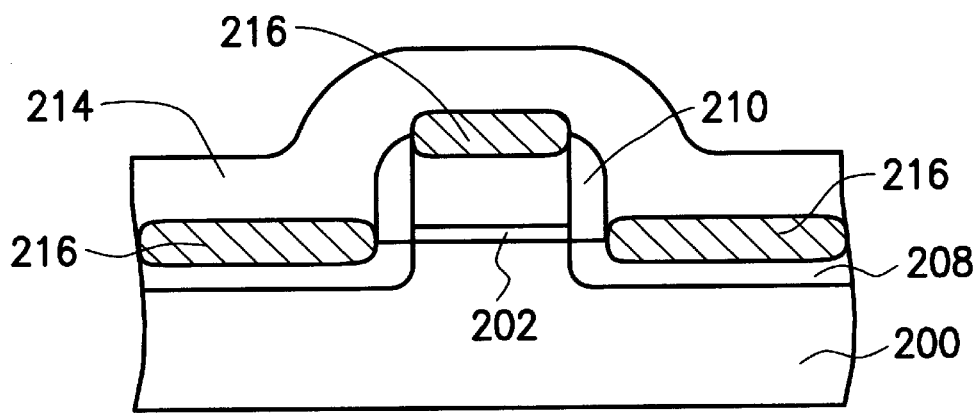

As shown in FIG. 2A, a metal layer 212 is formed over the substrate 200 by R.F. sputtering and a material layer 214 is formed thereon. A high temperature process is performed to make metal layer 212 react with the polysilicon layer 204 and the source/drain region 208 on the substrate 200. Silicide 216 is thereby formed, as shown in FIG. 2B. During the formation of the silicide 216, if compressive stress is produced at silicide 216/polysilicon layer 204, a material layer 214, such as silicon oxide layer, is formed on the metal layer 212 prior to the formation of the silicide 216. Therefore tensile stress at the silicon oxide layer/metal layer 212 and compressive stress at the substrate/polysilicon layer can be reduced. A material layer 214, such as silicon nitride layer, is formed on the metal layer 212 prior to the formation of silicide 216 because tensile stress is produced at silicide 216/polysilicon layer 204. Accordingly, compressive stress at the nitride layer/metal layer 212 interface and tensile stress at the substrate/polysilicon interface can be reduced.

Tensile stress is produced by titanium when titanium is selected for metal layer 212. A material layer 214 with the same stress, such as silicon oxide layer, is therefore selected to reduce the tensile stress of titanium and the compressive stress on the substrate 200 due to the formation of silicide 216. The thickness of silicon oxide layer is in a range of about 800–12000Å.

Compressive stress is produced by cobalt when cobalt is selected for metal layer 212. A material layer 214 with the same stress, such as a silicon nitride layer, is therefore selected to reduce compressive stress of cobalt and tensile stress on the substrate 200 due to the formation of silicide 216.

The stress can be adjusted by the thickness of the material layer 214 and the formation of the silicide 216 can be formed in a preferable environment.

Figure 2C:
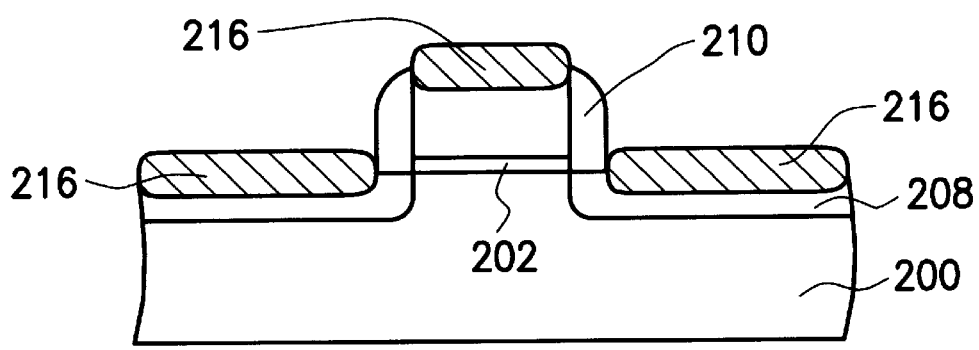

In FIG. 2C, the material layer, the unreacted metal layer and unnecessary product are removed to expose the polysilicon layer 204 and the silicide 216 on the source/drain region 208 to accomplish the salicide gate structure.

The formation of different material layers on the metal layer to produce different stress on the substrate is used in this invention to reduce the effect of stress on the substrate produced by the formation of silicide. Additionally, the formation of the silicide is enhanced and the resistance of silicide is also decreased.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method of fabricating salicide, wherein a substrate with a poly gate and a source/drain region is provided, the method comprising:

forming a metal layer on the substrate to cover the poly gate and the source/drain region;

forming a material layer on the metal layer, wherein the material layer has substantially the same stress as the metal layer; and performing a high temperature process to form a silicide on the poly gate and the source/drain region.

2. The method according to claim 1, wherein the metal layer includes titanium and the material layer includes a silicon oxide layer.

3. The method according to claim 1, wherein the metal layer includes cobalt and the material layer includes a silicon nitride layer.

4. A method of fabricating salicide, wherein a substrate with a poly gate and a source/drain region is provided, the method comprising:

forming a metal layer on the substrate to cover the poly gate and the source/drain region, wherein the metal layer has a tensile stress;

forming a material layer on the metal layer, wherein the material layer has a tensile stress that is substantially the same as the metal layer; and performing a high-temperature process to formed a silicide on the poly gate and the source/drain region.

5. The method according to claim 4, wherein the metal layer includes titanium.

6. The method according to claim 4, wherein the material layer includes silicon oxide layer.

7. A method of fabricating salicide, wherein a substrate with a poly gate and a source/drain region is provided, the method comprising:

forming a metal layer on the substrate to cover the poly gate and the source/drain region, wherein the metal layer has a compressive stress;

forming a material layer on the metal layer, wherein the material layer has a compressive stress that is substantially the same as the metal layer; and performing a high temperature process to formed a silicide on the poly gate and the source/drain region.

8. The method according to claim 7, wherein the metal layer includes cobalt.

9. The method according to claim 7, wherein the material layer includes silicon nitride layer.

* * * * *